(12) United States Patent
Lee et al.

(10) Patent No.: US 9,773,668 B2
(45) Date of Patent: Sep. 26, 2017

(54) APPARATUS FOR FORMING A TRANSITION METAL CHALCOGENIDE THIN-FILM

(71) Applicant: UNIVERSITY-INDUSTRY FOUNDATION (UIF), YONSEI UNIVERSITY, Seoul (KR)

(72) Inventors: Gwan Hyoung Lee, Seoul (KR); So Jung Kang, Seoul (KR); Seung Min Lee, Seoul (KR); Yong Soo Cho, Seoul (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/205,983

(22) Filed: Jul. 8, 2016

(65) Prior Publication Data

US 2017/0011916 A1    Jan. 12, 2017

(30) Foreign Application Priority Data

Jul. 9, 2015  (KR) .................. 10-2015-0097543

(51) Int. Cl.
| | |
|---|---|
| *H01L 21/02* | (2006.01) |
| *C23C 14/22* | (2006.01) |
| *C23C 14/04* | (2006.01) |
| *C23C 14/58* | (2006.01) |

(52) U.S. Cl.
CPC ...... *H01L 21/02568* (2013.01); *C23C 14/046* (2013.01); *C23C 14/22* (2013.01); *C23C 14/5806* (2013.01); *C23C 14/5866* (2013.01); *H01L 21/0242* (2013.01); *H01L 21/02381* (2013.01); *H01L 21/02614* (2013.01)

(58) Field of Classification Search
CPC ......... H01L 21/02568; H01L 21/02614; H01L 21/477; H01L 21/0242; H01L 21/02381; C23C 16/44; C23C 14/22
See application file for complete search history.

(56) References Cited

U.S. PATENT DOCUMENTS

| | | | | |
|---|---|---|---|---|
| 2010/0261304 | A1* | 10/2010 | Chang ................ | C23C 18/06 438/72 |
| 2011/0200516 | A1* | 8/2011 | McAlister ............ | B01J 19/127 423/418.2 |
| 2012/0118878 | A1* | 5/2012 | Kim .................. | H01M 8/04029 219/660 |

(Continued)

FOREIGN PATENT DOCUMENTS

| | | |
|---|---|---|
| KR | 10-2007-0080940 | 8/2007 |
| KR | 10-2013-0103913 | 9/2013 |
| KR | 10-1523172 | 5/2015 |

*Primary Examiner* — Bilkis Jahan

(57) ABSTRACT

Provided is a method of forming a transition metal chalcogenide thin-film and the method includes preparing a first substrate having formed thereon a transition metal-containing precursor thin-film; displacing a second substrate separately with a constant distance from the first substrate by using a bridge unit while the second substrate is facing the first substrate, thereby securing a gas flowing path between the first substrate and the second substrate; heating the first and second substrates to a reaction temperature; and introducing a chalcogen-containing gas from an end of a reactor, such that the chalcogen-containing gas flows via the path.

18 Claims, 4 Drawing Sheets

(56) References Cited

U.S. PATENT DOCUMENTS

| | | | | |
|---|---|---|---|---|
| 2013/0145761 A1* | 6/2013 | McAlister | ............ | F03G 7/05 60/641.7 |
| 2013/0153399 A1* | 6/2013 | McAlister | ............ | B01J 19/0053 203/25 |
| 2014/0091296 A1* | 4/2014 | Yoo | ............ | C09J 11/00 257/40 |

* cited by examiner

MoS₂ film on Sapphire (Scratched)   Triangular MoS₂ on Sapphire

APPARATUS FOR FORMING A TRANSITION METAL CHALCOGENIDE THIN-FILM

CROSS-REFERENCE TO RELATED APPLICATION

This application claims priority of Korean Patent Application No. 10-2015-0097543, filed on Jul. 9, 2015, in the KIPO (Korean Intellectual Property Office), the disclosure of which is incorporated herein entirely by reference.

BACKGROUND OF THE INVENTION

Field of the Invention

The present disclosure relates to a technique for fabricating a transition metal chalcogenide (TMC), and more particularly, to a method of fabricating a transition metal chalcogenide in large scale and an apparatus used for the method.

Description of the Related Art

A conventional technique for fabricating a chalcogenide thin-film is known (e.g., Korean Patent Open Publication No. 10-2007-80940, published on May 25, 2015).

Transition metal dichalcogenides (TMDs) are materials having planar structures having a single layer constituted of 3 atomic layers, similar to that of graphene having a single carbon atomic layer. Unlike graphene having metalloid characteristics, transition metal dichalcogenides exhibit characteristics of an n-type semiconductor, a p-type semiconductor, or a bipolar semiconductor according to the constituent materials of the transition metal dichalcogenides. Furthermore, since the transition metal dichalcogenides have thicknesses smaller than or equal to several nanometers, the transition metal dichalcogenides are highly useful for flexible devices and transparent devices so that it may be a promising material fields of nano-device. However, for research and industrial application of the transition metal chalcogenides, a large scale growth technique is essential. Up to now, transition metal chalcogenides are being fabricated by using techniques like chemical vapor deposition, physical vapor deposition, or atomic layer deposition. However, it is difficult to fabricate a uniformly high-quality large-scale 2-dimensional semiconductor.

$MoS_2$, which is one of the most popular transition metal dichalcogenides, is a material having a planar structure including three atomic layers one Mo atomic layer and two S atomic layers above and below the Mo atomic layer, where the three atomic layers constitute a hexagonal crystal structure. $MoS_2$ is one of the most popular 2-dimensional semiconductor material that can exhibit bipolar characteristic due to the availability of both electrons and holes as carrier charges, and a thin film of $MoS_2$ is mainly used as a p-type semiconductor. $MoS_2$ is reported to have a theoretical mobility up to 400 $cm^2/Vs$, has a high $I_{on}/I_{off}$ equal to or above $10^8$, and is being an attractive semiconductor material applicable to a transparent and flexible device. Furthermore, a bilayer or higher-order $MoS_2$ structure exhibits an indirect bandgap (about 1.3 eV), whereas a monolayer $MoS_2$ structure exhibits a direct bandgap (about 1.9 eV) and excellent photoluminescence characteristic. In this view, $MoS_2$ may also be applied to an optoelectronic device. Furthermore, $MoS_2$ is expected to be utilized in various fields including the valleytronics. Examples of $MoS_2$ synthesizing methods include top-down methods and bottom-up methods. Although the most popular top-down method is a mechanical exfoliation, but it is difficult to use the method for mass production. Meanwhile, bottom-up methods have problems including complicated operations and high costs.

Conventionally, solid powders of a transition metal, such as Mo or $MoO_2$, and sulfur powders are together vaporized at a high temperature and are synthesized on a substrate. However, it is difficult to fabricate a uniform large film with such a common synthesizing method. In particular, it is difficult to uniformly deposit a transition metal by the method, and thus a film cannot be uniformly formed on a substrate. In the method, solid powders are disposed in a reactor and is vaporized toward and synthesized on a substrate. In this case, composition of the synthesized film varies according to locations of the substrate, and thus a uniform thin-film cannot be formed throughout the substrate. Furthermore, the thickness of the film formed by using such a method becomes so large (e.g., equal to or greater than about 10 nm), grains size of the film is so small (e.g., a few 10~a few 100 nm) and the electrical property is so poor that the method cannot be efficiently utilized.

SUMMARY OF THE INVENTION

The present invention provides a method of uniformly fabricating a transition metal chalcogenide in large scale by a simplified process.

The present invention also provides a method of uniformly fabricating a transition metal chalcogenide on a substrate in large scale by using a so-called solid method instead of a solution method.

The present invention also provides an apparatus for fabricating a transition metal chalcogenide that is suitably configured to implement the above methods.

According to an aspect of the present invention, there is provided a method of forming a transition metal chalcogenide thin-film, the method including, preparing a first substrate having formed thereon a transition metal-containing precursor thin-film; displacing a second substrate separately with a constant distance from the first substrate by using a bridge unit while the second substrate is facing the first substrate, thereby securing a gas flowing path between the first substrate and the second substrate; heating the first and second substrates to a reaction temperature; and introducing a chalcogen-containing gas from an end of a reactor, such that the chalcogen-containing gas flows via the path. During the heating of the first and second substrates, a transition metal may be partially vaporized from the transition metal-containing precursor thin-film and the vaporized transition metal diffuses toward the second substrate. In addition, the transition metal may react with the chalcogen-containing gas and form a transition metal chalcogenide thin-film on a surface of the second substrate.

At least one of the first substrate and the second substrate may be a sapphire substrate, a silicon substrate, or an oxide substrate.

The bridge unit may include a material that has no reactivity with the transition metal and the chalcogen-containing gas. (e.g., a silicon oxide or aluminum oxide).

The bridge unit may interconnect the first and second substrates at side edges of the first and second substrates, thereby securing the path between the first and second substrates.

The heating of the first and second substrates may include heating the first and second substrates from the room temperature to the reaction temperature; and annealing the first and second substrates by maintaining the reaction temperature for a certain period of time.

The reaction temperature may be a temperature that is sufficient to form a transition metal by vaporizing the transition metal thin-film on the first substrate while the temperature does not vaporize the transition metal chalcogenide thin-film.

The sulfur-containing gas may be supplied into the reactor after the annealing of the first and second substrates.

The sulfur-containing gas may be supplied into the reactor together with a carrier gas.

The property of the transition metal chalcogenide thin-film formed on the second substrate may be controlled by adjusting reaction time of the vaporized transition metal and the chalcogen-containing gas at the reaction temperature.

The transition metal chalcogenide thin-film may include a single layer or multiple layers. In addition, a thickness of the transition metal chalcogenide thin-film may be controlled by a process condition.

The transition metal thin-film on the first substrate may be a transition metal thin-film or transition metal oxide thin-film, and the transition metal chalcogenide thin-film on the second substrate may be a compound formed by a reaction between the vaporized transition metal and the chalcogen-containing gas.

According to another aspect of the present invention, there is provided an apparatus for forming a transition metal chalcogenide thin-film, the apparatus including a reactor; a heating member configured to heat the reactor; a thin-film forming unit disposed inside the reactor; and a controller that controls the overall operations of the apparatus. The thin-film forming unit may comprise a first substrate having formed thereon a transition metal-containing precursor thin-film; a second substrate that faces the first substrate and is disposed above the first substrate; and a substrate supporting unit that separates the first substrate and the second substrate with a predetermined distance. The reactor may be connected to an external gas supplying apparatus.

The substrate supporting unit may interconnect the first substrate and the second substrate at side edges of the first substrate and the second substrate, thereby securing a gas flowing path between the first substrate and the second substrate.

According to another aspect of the present invention, there is provided an apparatus for forming a transition metal chalcogenide thin-film, the apparatus including a reactor; a heating member disposed around the reactor and configured to heat the reactor; a thin-film forming unit disposed inside the reactor; and a controller that controls the overall operations of the apparatus. The thin-film forming unit may comprise a hollow unit. A substrate supporting units for mounting a plurality of substrates may be formed on the inner surface of the hollow unit. In addition, a first substrate having formed thereon a transition metal thin-film may be supported by the bottommost substrate supporting units. One or more second substrates may be supported above the first substrate by the substrate supporting units to face the first substrate, and the reactor may be connected to an external gas supplying apparatus.

The substrate supporting unit may be grooves formed on the inner surface of the hollow unit.

The controller may be configured to heat the reactor to a certain reaction temperature by controlling the heating member.

The controller may be configured to heat the reactor from the room temperature to the reaction temperature and maintain the reaction temperature for a certain period of time.

The controller may be configured to maintain the reactor at the reaction temperature, such that a chalcogen-containing gas supplied from the gas supplying apparatus reacts with a transition metal formed by vaporization of the transition metal-containing precursor thin-film on the first substrate and forms the transition metal chalcogenide thin-film on the second substrate.

Each of the first substrate and the second substrate may be a sapphire substrate, a silicon substrate or oxide substrate.

The transition metal thin-film on the first substrate may be a molybdenum (Mo)-containing precursor thin-film, and the transition metal chalcogenide thin-film on the second substrate may be a $MoS_2$ thin-film.

According to the present invention, a transition metal chalcogenide thin-film having a small thickness may be uniformly formed on a certain substrate in large scale.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, embodiments of the present invention will be described with reference to the attached drawings. Hereinafter, descriptions of technical configurations widely known in the art will be omitted. For example, chemical vapor deposition (CVD) or physical vapor deposition (PVD) may be used for forming a thin-film on a substrate. Since such techniques are widely known in the art, detailed description thereof will be omitted. Even without the descriptions, one of ordinary skill in the art will easily understand the technical features of the present invention based on the descriptions given below.

Figure 1:
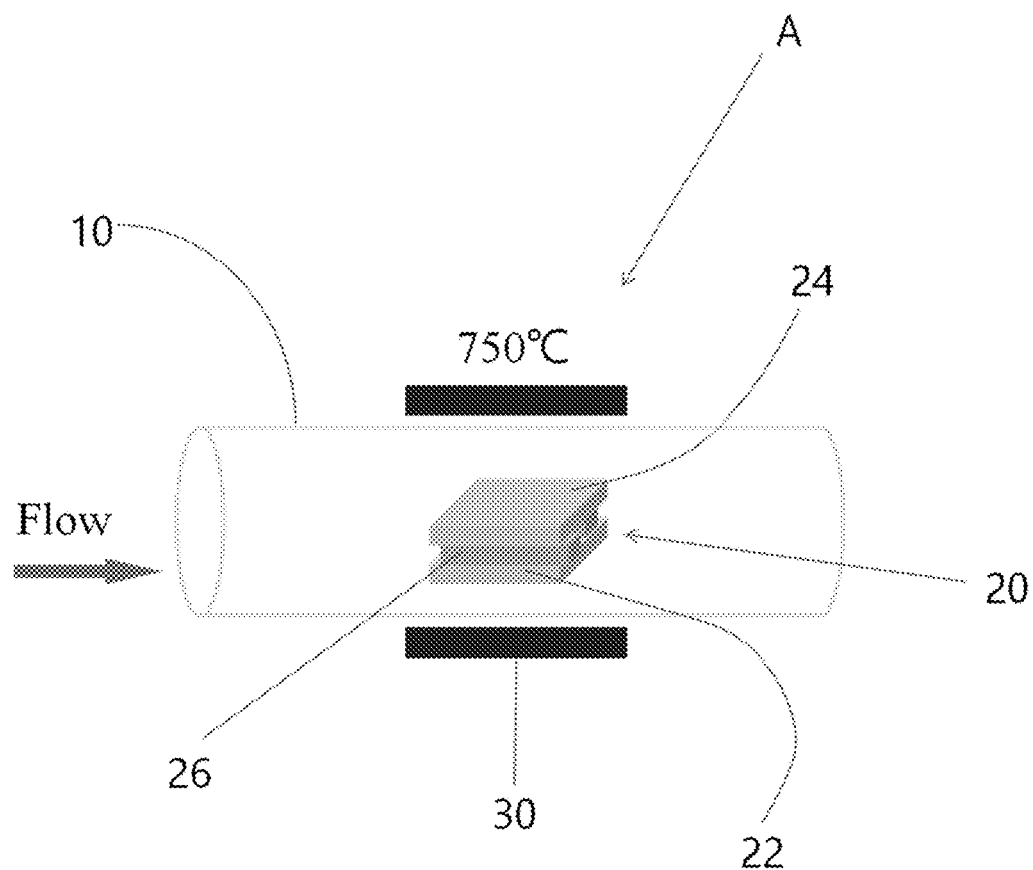
FIG. 1 is a schematic diagram showing a configuration of a thin-film forming apparatus according to an embodiment of the present invention.
Figure 2:
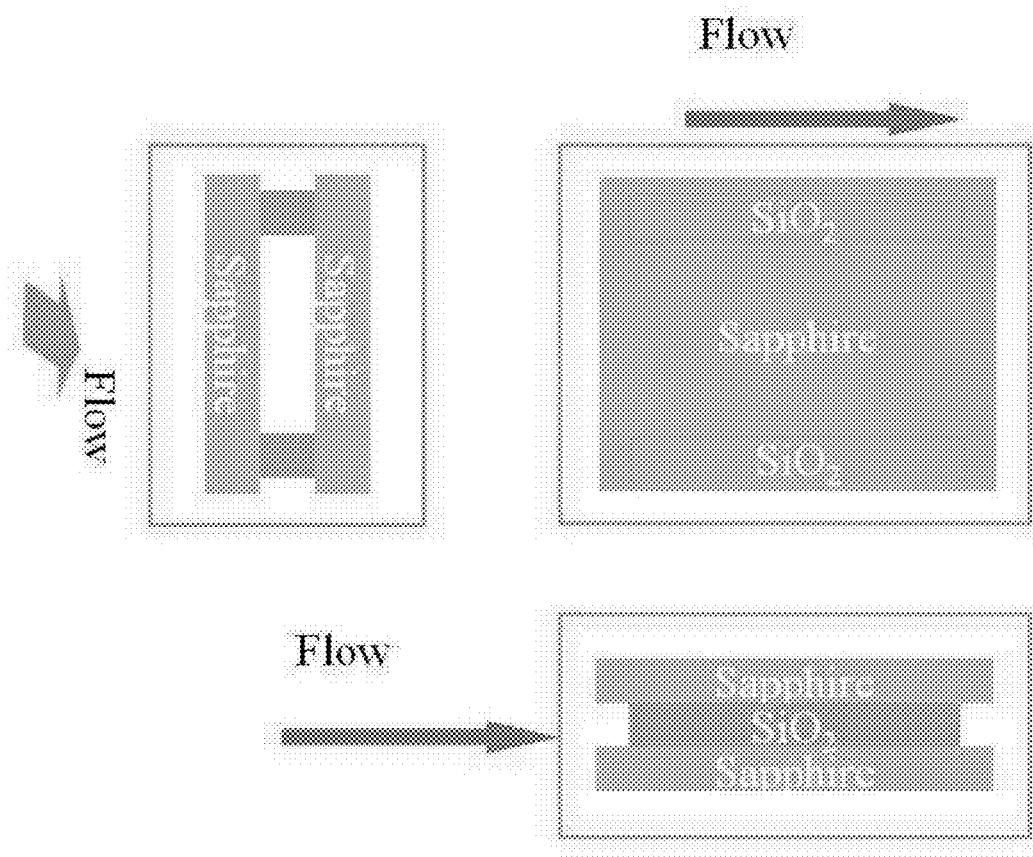
FIG. 2 is a lateral view, a plan view, and a front view of a pair of substrates mounted at the thin-film forming apparatus.

FIG. 1 is a schematic diagram showing a configuration of a thin-film fabricating apparatus A according to an embodiment of the present invention, and FIG. 2 is a lateral view, a plan view, and a front view of a pair of substrates mounted in the thin-film forming apparatus A.

Referring to FIG. 1, the thin-film forming apparatus A may include a reactor 10. Inside the reactor 10, a certain thin-film forming process is performed to form a transition metal chalcogenide thin-film. The reactor 10 may be a common reactor used in the art, where the present invention is not limited by configurations of the reactor 10.

A heating member 30 may be disposed around the reactor 10. The heating member 30 may be a member for driving a thin-film forming process inside the reactor 10 by heating the reactor 10, where the configurations of the heating member 30 is not limited to the illustrated example. For example, the heating member 30 may include a heating coil or a halogen lamp.

As shown in FIG. 1, a thin-film forming unit 20 including a pair of substrates 22 and 24 and a bridge unit 26 that separates the pair of substrates 22 and 24 from each other by a certain distance and interconnects the pair of substrates 22 and 24 may be disposed inside the reactor 10.

Referring to FIGS. 1 and 2, the thin-film forming unit 20 includes a first substrate 22, a second substrate 24 that is disposed to face the first substrate 22, and the bridge unit 26 that separates the first substrate 22 and the second substrate 24 from each other at side edges of the first substrate 22 and the second substrate 24.

According to an example, at least one of the pair of substrates 22 and 24 may be a sapphire substrate. Unlike a $SiO_2$ substrate, the sapphire substrate has a hexagonal crystal structure on the (0001) plane, thereby being advantageous for aligning and epitaxially growing MoS to be formed in a crystallizing direction. However, the present invention is not limited to the sapphire substrate and, as unlimited examples, other crystalline substrates like a silicon substrate, a strained silicon substrate, a germanium substrate, and a compound semiconductor substrate (e.g., an InP substrate) may be used. The bridge unit 26 interconnecting the pair of substrates 22 and 24 may be formed of a material that has a low or no reactivity with molybdenum (Mo) or sulfur (S). For example, since $SiO2$ does not react with Mo or S, the bridge unit 26 may be formed of the $SiO_2$. However, the bridge unit 26 may be formed of other materials that do not react with Mo or S than $SiO_2$.

In an example, by controlling the separation distance between the first substrate 22 and the second substrate 24, for example, by adjusting the thickness of the bridge unit 26 (vertical directions in FIG. 1), characteristics of a grown thin-film may be controlled. In other words, as described below, according to an example of the present invention, as a transition metal thin-film formed on the first substrate 22 during a heat treatment is used in itself as a precursor and, then is vaporized from the first substrate 22, the transition metal thin-film reacts with S, and thus a predetermined thin-film may be formed on the second substrate 24. Here, according to the separation distance between the first substrate 22 and the second substrate 24 (that is, the thickness of the bridge unit 26), moving distance (or delivery length) of the transition metal atom or cluster vaporized from the first substrate 22 to the second substrate 24 varies, and thus characteristic of the thin-film formed on the second substrate 24 varies based on the moving distance. The example of the method for controlling the separation distance between the first substrate 22 and the second substrate 24 should not be construed to be limited to the bridge unit, other examples for separating uniformly the two substrates with a constant distance is under the scope of the present invention. For example, any spacer having uniform thickness or variable thickness or zig for supporting the two substrates 22 and 24 may be utilized to separate the two substrates 22 and 24.

Hereinafter, a process for uniformly forming a transition metal chalcogenide thin-film in large scale by using the thin-film forming apparatus A according to an embodiment will be described in detail.

First, a transition metal-containing precursor thin-film (e.g., a pure transition metal thin-film; for example, a molybdenum (Mo) thin-film) is uniformly deposited on the first substrate 22 in large scale. Here, the deposition of the transition metal-containing precursor thin-film may be performed by using a common vapor deposition technique, such as chemical vapor deposition (CVD), or physical vapor deposition (PVD), such as sputtering, or heat vaporization. In other words, according to the present invention, in order to form a transition metal chalcogenide thin-film, the first substrate 22 having formed thereon a transition metal thin-film is prepared in advance, where the preparation is one of technical features of the present invention. A uniformly deposited transition metal-containing precursor thin-film provides a 2-dimensional thin-film transition metal vaporization source having a substantially uniform thickness and/or composition. The uniform thin-film 2-dimensional vaporization source may provide a thin-film deposition method capable of uniformly forming a transition metal chalcogenide on the second substrate 24 in large scale. According to an embodiment, the thickness of the transition metal-containing precursor thin-film may be varied based on the thickness of the transition metal chacogenide thin-film, for example, a few nm to a few 100 nm.

Next, while the first substrate 22 and the second substrate 24 are disposed to face each other, the first substrate 22 and the second substrate 24 may be supported by the bridge unit 26. Here, unlike the first substrate 22, no thin-film may be formed on the second substrate 24 (i.e., the second substrate is a bare substrate) or the second substrate 24 may have a prepared surface (e.g., a crystalline surface for epitaxial growth is formed on the second substrate) or a suitable underlying structure (or layer) for forming the transition metal chalcogenide thin-film. According to an embodiment, an area of a portion of the second substrate 24 facing the first substrate 22 may be identical to an area of a portion of the first substrate 22 facing the second substrate 24. Meanwhile, as described below, the bridge unit 26 may be disposed at side edges of the pair of substrates 22 and 24 to not to interrupt gas flow.

The bridge unit 26 may secure a path in which a gas may flow between the first substrate 22 and the second substrate 24. In addition, the bridge unit 26 may secure the condition under that the transition metal vaporized from the first substrate 24 can be deposited with a predetermined thickness on the second substrate 24.

Figure 3:
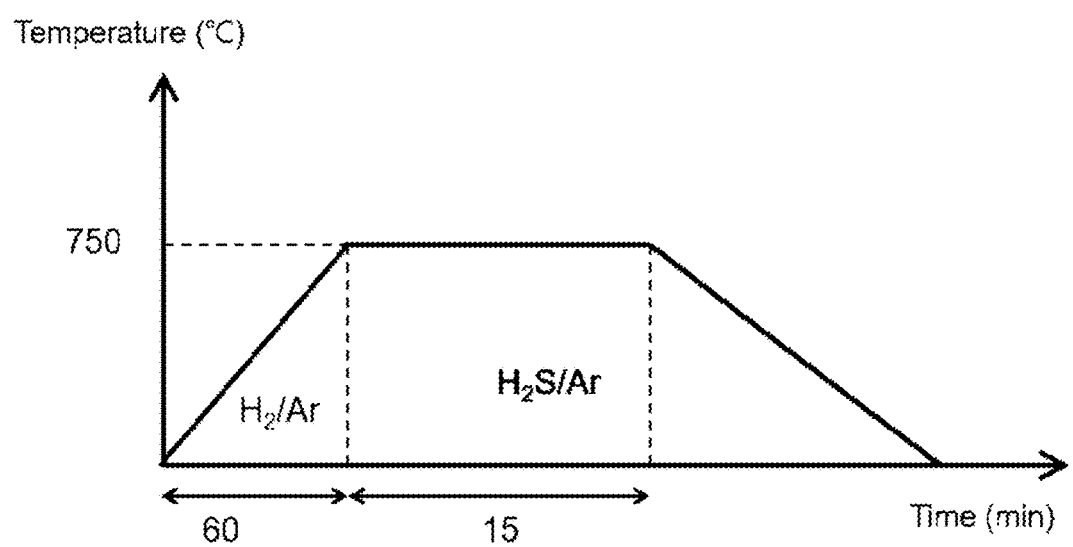
FIG. 3 is a diagram showing a heat treatment operation for forming a transition metal dichalcogenide thin-film by using the apparatus in the form of a time-temperature plot.

After the thin-film forming unit 20 configured as described above is disposed inside the reactor 10, a suitable gas, e.g., a sulfur-containing gas, an inert gas like argon (Ar) or helium (He), a reducing gas like hydrogen ($H_2$), or a mixture thereof is introduced, and ambient temperature may be raised from the room temperature to a temperature within a range from about 500° C. to about 1000° C. According to an embodiment, the temperature of the thin-film forming unit 20 may be raised to a temperature of about 750° C. According to an embodiment, a transition metal in the transition metal-containing thin-film formed on the first substrate 22 (e.g., molybdenum (Mo), tungsten (W), titanium (Ta), manganese (Mn), iron (Fe), cobalt (Co), copper (Cu), zinc (Zn), zirconium (Zr), ruthenium (Ru), rhodum (Rh), paladum (Pa), Yitrium (Y), or iridium (Ir)) is partially vaporized, delivered to the surface of the second substrate 24 and, then, functions as a seed of a predetermined thin-film to be formed on the second substrate 24. For example, as shown in FIG. 3, while the gas is being introduced into the reactor 10 as a flux of about 0.3 L per minute, substrates 22 and 24 are heated to the temperature by heating them for about an hour, and an annealing operation is performed for about 15 minutes under an isothermal condition. Due to the annealing operation, a reaction residue may be removed. The conditions, for example, heating temperature, gas, and time of the annealing operation can be variously modified or even can be omitted based on a synthesized transition metal chalcogenide material under the present invention.

Next, while an isothermal condition is being maintained at about 750° C., Ar gas (carrier gas) and a sulfur-containing gas (e.g., $H_2S$) supplied from a gas supplying apparatus (not shown) are introduced at an end of the reactor 10 and supplied toward the thin-film forming unit 20. Here, the sulfur-containing gas may be obtained by vaporizing sulfur-containing powders, for example. When the Ar+$H_2S$ process gas is supplied toward the thin-film forming unit 20 for about 10 minutes, the process gas flows via the path secured by the bridge unit 26 of the thin-film forming unit 20.

Meanwhile, as described above, during the heat treatment and the annealing operation, a precursor in the transition metal-containing precursor thin-film formed on the first substrate 22 is vaporized and diffused toward the second substrate 24, thereby providing a uniform flux of a certain transition metal to the second substrate 24. The diffused transition metal, e.g., molybdenum (Mo), may react with the Ar+$H_2S$ process gas. Sulfur (S) and molybdenum (Mo) react with each other, and thus a $MoS_2$ thin-film may be formed on the second substrate 24. The reaction may occur in the pass before a flux of the transition metal arrives the second substrate 24, and/or on the second substrate 24 after the transition metal arrives the second substrate 24.

Furthermore, the transition metal-containing precursor thin-film on the first substrate 22, e.g., the molybdenum (Mo) thin-film, may also react with sulfur (S), and thus a reaction layer of a transition metal, e.g., $MoS_2$, may be formed on a surface of the first substrate 22. Here, the $MoS_2$ thin-film formed on the first substrate 22 may be thicker than the $MoS_2$ thin-film formed on the second substrate 24.

As described above, a molybdenum (Mo)-containing precursor thin-film is formed on the first substrate 22 in advance. However, such a molybdenum (Mo)-containing precursor thin-film may be a relatively large thickness (equal to or greater than about 10 nm) and, therefore, even if Mo is partially vaporized from the molybdenum (Mo)-containing precursor thin-film during a heat treatment and an annealing operation, the thickness of the molybdenum (Mo)-containing precursor thin-film may remain still relatively large. Therefore, a $MoS_2$ thin-film that is formed on the first substrate 22 by a reaction between the remaining molybdenum (Mo)-containing precursor thin-film and sulfur (S), and the $MoS_2$ thin-film may be relatively thick. However, contrary to the $MoS_2$ thin-film formed on the first substrate 22, as Mo gas generated from vaporization of a Mo thin-film on the first substrate 22 reacts with sulfur (S) of Ar+$H_2S$ process gas, the $MoS_2$ thin-film formed on the second substrate 24 may be relatively thin and may be even uniform. For example, the thickness of $MoS_2$ thin-film formed on the second substrate 24 can be controlled by the thickness of the molybdenum (Mo)-containing precursor thin-film on the first substrate 22 and/or other process conditions so that the thickness of $MoS_2$ thin-film formed on the second substrate 24 may be from monolayer (about 0.7 nm) to a few layers (about 1.3 nm~10 nm).

According to an embodiment, as described above, the molybdenum (Mo)-containing precursor thin-film on the first substrate 22 may react with sulfur (S) of the Ar+$H_2S$ process gas and may be transformed to $MoS_2$. In this case, vaporization of Mo from the molybdenum (Mo)-containing precursor thin-film may be ceased, and thus supply of molybdenum (Mo) to the second substrate 24 may be blocked. Therefore, the $MoS_2$ thin-film on the second substrate 24 may become thinner than the $MoS_2$ thin-film on the first substrate 22. Based on the mechanism, the temperature of the reactor 10 may be maintained to a temperature that is sufficient to vaporize the transition metal-containing precursor thin-film (that is, molybdenum (Mo)-containing precursor thin-film) and does not vaporize a transition metal chalcogenide thin-film formed by a reaction. Meanwhile, as temperature increases, sufficient energy for forming $MoS_2$ may be supplied, and thus larger crystal grains may be formed. As a result, a thin-film exhibiting excellent electric characteristics may be formed.

Figure 4:
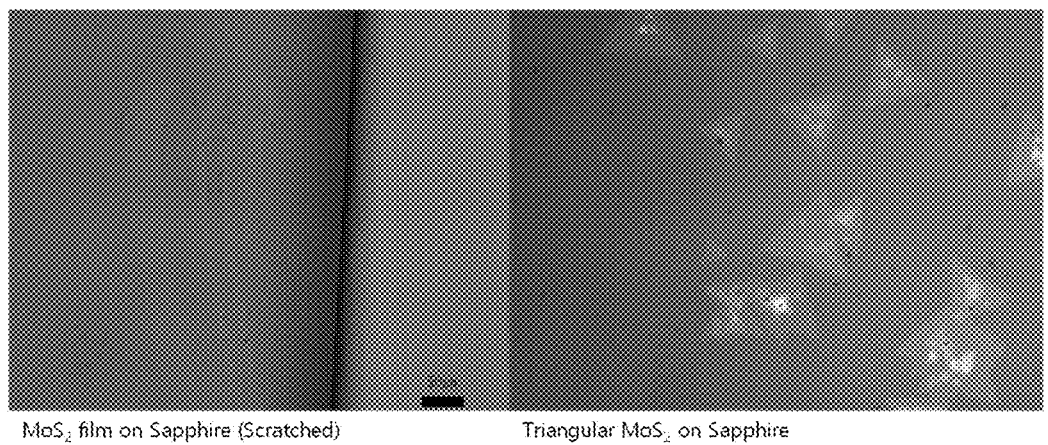
FIG. 4 is a microscopic image showing a surface of a MoS2 thin-film formed on a substrate by using the apparatus, where shape of the thin-film varies according to growth time.

Meanwhile, changes of a surface shape of the $MoS_2$ thin-film formed on the second substrate 24 according to reaction times have been observed. Referring to FIG. 4, if a reaction time is short, $MoS_2$ is distributed in the form of single crystals instead of a thin-film (the right part of FIG. 4). If a reaction occurs for a sufficient time, an overall uniform $MoS_2$ thin-film may be formed as shown in the left part of FIG. 4.

Figure 5:
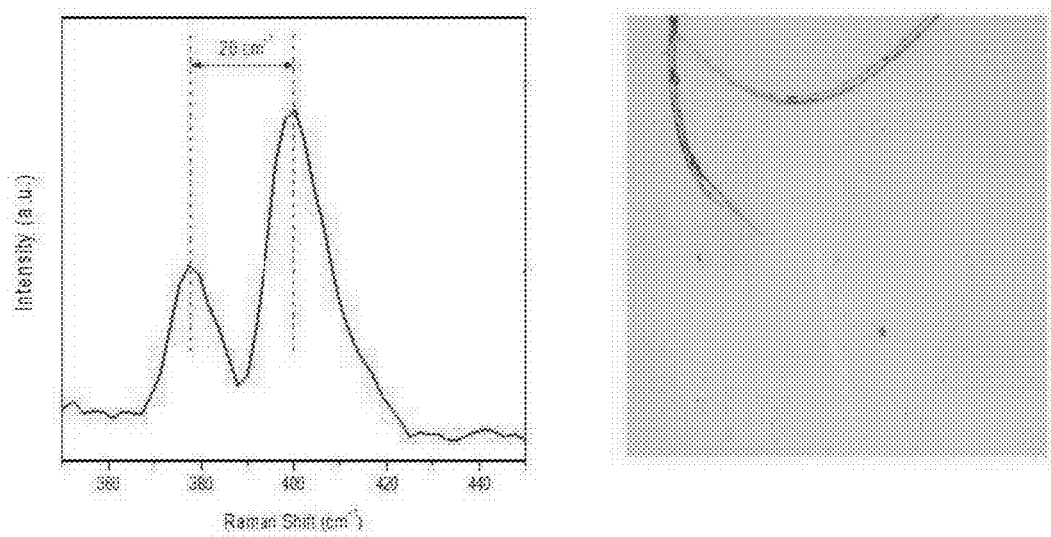
FIG. 5 is a Raman graph regarding a $MoS_2$ thin-film formed on a substrate by using the apparatus, where the MoS2 thin-film is formed as a single layer.

FIG. 5 is a diagram showing a result of Raman spectrum analysis regarding a $MoS_2$ thin-film formed on the second substrate 24 according to an embodiment. As shown in FIG. 5, as a result of the Raman spectrum analysis, two main peaks of the $MoS_2$ thin-film were observed, where the thickness of the $MoS_2$ thin-film may be calculated based on the distance between the two peaks. As shown in FIG. 5, the distance between the two main peaks is about 20 $cm^{-1}$, where the short distance indicates that the MoS$_2$ thin-film is formed as a single layer. In other words, according to the present invention, a MoS$_2$ thin-film may be uniformly formed as a single layer in large scale. Optionally, by controlling the conditions, a relatively thick MoS$_2$ thin-film with multiple layers can be formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, in the above embodiment, a thin-film forming unit includes a pair of substrates facing each other and a bridge unit that interconnects the pair of substrates. However, configurations of the thin-film forming unit are not limited thereto. For example, the thin-film forming unit may have a hollow structure, where a substrate supporting unit, such as grooves for mounting a plurality of substrates, may be formed therein. In this case, a first substrate having formed thereon a transition metal thin-film is mounted by inserting the first substrate into the bottommost grooves, and one or more other substrates may be mounted on another grooves above the bottommost grooves. In this case, instead of disposing a thin-film forming unit including two substrates connected to each other via a bridge unit 26 every time the reaction is performed, if the first substrate is disposed at the bottom and a plurality of substrates are disposed above the first substrate, the thin-film forming operations may be conveniently performed by simply removing the first substrate and a substrate immediately above the first substrate (that is, a substrate having formed thereon a transition metal chalcogenide thin-film) and disposing another first substrate at the bottom after every reaction.

Furthermore, although a sapphire substrate is exemplified as a substrate used in the above embodiment, the present invention is not limited thereto. For example, a silicon substrate, a quartz substrate, or an oxide substrate, such as a silicon oxide substrate, may be used alternatively.

Furthermore, although the bridge unit (connecting member) is formed of a silicon oxide in the above embodiment, the present invention is not limited thereto. In other words, the bridge unit may be formed of any material, for example, aluminum oxide or silicon nitride that does not react with materials like gases. Herewith, the terms "bridge unit" and "substrate supporting units" may be interchangeably used as having a same meaning.

Furthermore, although the molybdenum (Mo)-containing precursor thin-film is exemplified as a transition metal thin-film formed on the first substrate in the above embodiment, the present invention is not limited thereto. In other words, one of various other transition metal thin-films other than molybdenum (Mo) thin-film may be used as a precursor thin-film, and thus various transition metal chalcogenide thin-films may be formed on the second substrate.

Furthermore, although not described above in detail, an apparatus according to the present invention may include a control device that is configured to control the overall operations of the apparatus (e.g., heating operation, annealing operation, isothermal condition maintaining operation, etc.). Such a modified embodiment is also within the scope of the present invention, and thus the present invention is only limited by the following claims and equivalents thereto.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus for forming a transition metal chalcogenide thin-film, the apparatus comprising:
   a reactor connected to an external gas supplying apparatus;
   a heating member configured to heat the reactor;
   a thin-film forming unit disposed inside the reactor; and
   a controller that controls at least one of the reactor, the external gas supplying apparatus, the heating member, and the thin-film forming unit,
   wherein the thin-film forming unit comprises:
      a first substrate having formed thereon a transition metal-containing precursor thin-film;
      a second substrate that faces the first substrate and is disposed above the first substrate; and
      a displacing member that separates the first substrate and the second substrate with a predetermined distance.

2. The apparatus of claim 1, wherein the displacing member interconnects the first substrate and the second substrate at side edges of the first substrate and the second substrate, thereby securing a gas flowing path between the first substrate and the second substrate.

3. An apparatus for forming a transition metal chalcogenide thin-film, the apparatus comprising:
   a reactor connected to an external gas supplying apparatus;
   a heating member disposed around the reactor and configured to heat the reactor;
   a thin-film forming unit disposed inside the reactor, the thin-film forming unit comprises a hollow unit; and
   a controller that controls at least one of the reactor, the external gas supplying apparatus, the heating member, and the thin-film forming unit,
   wherein a plurality of substrate supporting units for mounting a plurality of substrates are formed on the inner surface of the hollow unit,
   wherein a first substrate having formed thereon a transition metal thin-film is supported by the bottommost substrate supporting units, and
   wherein one or more second substrates are supported above the first substrate by the substrate supporting units to face the first substrate.

4. The apparatus of claim 3, wherein the substrate supporting units are grooves formed on the inner surface of the hollow unit.

5. The apparatus of 3, the controller is configured to heat the reactor to a certain reaction temperature by controlling the heating member.

6. The apparatus of claim 5, wherein the controller is configured to heat the reactor from the room temperature to the reaction temperature and maintain the reaction temperature for a certain period of time.

7. The apparatus of claim 4, wherein the controller is configured to maintain the reactor at the reaction temperature, such that a chalcogen-containing gas supplied from the gas supplying apparatus reacts with a transition metal formed by vaporization of the transition metal-containing precursor thin-film on the first substrate and forms a transition metal chalcogenide thin-film on the second substrate.

8. The apparatus of claims 3, wherein each of the first substrate and the second substrate is a sapphire substrate or a silicon substrate.

9. The apparatus of claim 8, wherein the transition metal thin-film on the first substrate is a molybdenum (Mo)-containing precursor thin-film, and the transition metal chalcogenide thin-film on the second substrate is a $MoS_2$ thin-film.

10. An apparatus for forming a transition metal chalcogenide thin-film, the apparatus comprising:
    a reactor connected to an external gas supplying apparatus;
    a heating member disposed around the reactor and configured to heat the reactor;
    a thin-film forming unit disposed inside the reactor, the thin-film forming unit comprises a hollow unit;
    a plurality of substrate supporting units for mounting a plurality of substrates are formed on the inner surface of the hollow unit; and
    a controller that controls at least one of the reactor, the external gas supplying apparatus, the heating member, the thin-film forming unit, and the plurality of substrate supporting units.

11. The apparatus of claim 10, wherein the thin-film forming unit comprising:
    a first substrate having formed thereon a transition metal-containing precursor thin-film;
    a second substrate that faces the first substrate and is disposed above the first substrate; and
    a displacing member that separates the first substrate and the second substrate with a predetermined distance.

12. The apparatus of claim 11, wherein the displacing member interconnects the first substrate and the second substrate at side edges of the first substrate and the second substrate, thereby securing a gas flowing path between the first substrate and the second substrate.

13. The apparatus of claim 10, wherein the substrate supporting units are grooves formed on the inner surface of the hollow unit.

14. The apparatus of 10, the controller is configured to heat the reactor to a certain reaction temperature by controlling the heating member.

15. The apparatus of claim 14, wherein the controller is configured to heat the reactor from the room temperature to the reaction temperature and maintain the reaction temperature for a certain period of time.

16. The apparatus of claim 13, wherein the controller is configured to maintain the reactor at the reaction temperature, such that a chalcogen-containing gas supplied from the gas supplying apparatus reacts with a transition metal formed by vaporization of the transition metal-containing precursor thin-film on the first substrate and forms a transition metal chalcogenide thin-film on the second substrate.

17. The apparatus of claims 11, wherein each of the first substrate and the second substrate is a sapphire substrate or a silicon substrate.

18. The apparatus of claim 17, wherein the transition metal thin-film on the first substrate is a molybdenum (Mo)-containing precursor thin-film, and the transition metal chalcogenide thin-film on the second substrate is a $MoS_2$ thin-film.

* * * * *